United States Patent
Verma et al.

(10) Patent No.: US 9,867,032 B2
(45) Date of Patent: Jan. 9, 2018

(54) METHOD AND APPARATUS FOR TRANSMITTING USER INPUT FROM A SINK DEVICE TO A SOURCE DEVICE IN A WI-FI DIRECT COMMUNICATION SYSTEM

(75) Inventors: Lochan Verma, Seoul (KR); Luke Qian, San Jose, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 798 days.

(21) Appl. No.: 13/979,802

(22) PCT Filed: Jan. 13, 2012

(86) PCT No.: PCT/KR2012/000341
§ 371 (c)(1),
(2), (4) Date: Jul. 15, 2013

(87) PCT Pub. No.: WO2012/096546
PCT Pub. Date: Jul. 19, 2012

(65) Prior Publication Data
US 2013/0304794 A1    Nov. 14, 2013

Related U.S. Application Data

(60) Provisional application No. 61/432,779, filed on Jan. 14, 2011.

(51) Int. Cl.
*H04W 8/18* (2009.01)
*G06F 3/038* (2013.01)
(Continued)

(52) U.S. Cl.
CPC ............ *H04W 8/183* (2013.01); *G06F 3/038* (2013.01); *G06F 3/0484* (2013.01);
(Continued)

(58) Field of Classification Search
None
See application file for complete search history.

(56) References Cited

U.S. PATENT DOCUMENTS

| 7,714,911 B2 | 5/2010 | Yoshida |
| 8,788,716 B2 | 7/2014 | Kobayashi |

(Continued)

FOREIGN PATENT DOCUMENTS

| CN | 1462394 A | 12/2003 |
| CN | 1653817 A | 8/2005 |

(Continued)

OTHER PUBLICATIONS

"Wi-Fi Certified Wi-Fi Direct(TM)—Personal, portable Wi-Fi(R) technology", Wi-Fi Direct White Paper 20101025 Industry, Wi-Fi Alliance, US, Oct. 25, 2010 (Oct. 25, 2010), pp. 1-14, XP008165049.

(Continued)

*Primary Examiner* — Jeffrey R Swearingen
(74) *Attorney, Agent, or Firm* — Sughrue Mion, PLLC

(57) ABSTRACT

A method of performing communication between a sink device and a source device in a Wi-Fi direct network is provided. The method includes receiving a user's input, on a sink device, for controlling audio/video (AV) data received from the source device, generating a message for controlling the AV data based on the user's input, and transmitting the message to the source device through a Wi-Fi direct link.

16 Claims, 13 Drawing Sheets

(51) Int. Cl.
*G06F 3/0484* (2013.01)
*H04N 21/436* (2011.01)
*H04N 21/4363* (2011.01)
*H04N 21/41* (2011.01)
*H04N 21/472* (2011.01)

(52) U.S. Cl.
CPC ... *H04N 21/4126* (2013.01); *H04N 21/43615* (2013.01); *H04N 21/43637* (2013.01); *H04N 21/47205* (2013.01)

(56) References Cited

U.S. PATENT DOCUMENTS

| | | | |
|---|---|---|---|
| 2003/0185156 A1* | 10/2003 | Sato | H04L 12/2803 370/235 |
| 2005/0165967 A1* | 7/2005 | Woolgar | H04L 12/2805 709/203 |
| 2005/0198663 A1 | 9/2005 | Chaney et al. | |
| 2007/0297426 A1 | 12/2007 | Haveson et al. | |
| 2010/0060715 A1 | 3/2010 | Laasik et al. | |
| 2010/0205628 A1 | 8/2010 | Davis et al. | |
| 2011/0007692 A1 | 1/2011 | Seok | |
| 2011/0107388 A1 | 5/2011 | Lee et al. | |
| 2012/0154386 A1 | 6/2012 | Nagara et al. | |

FOREIGN PATENT DOCUMENTS

| | | |
|---|---|---|
| CN | 1757024 A | 4/2006 |
| CN | 101888514 A | 11/2010 |
| JP | 2007-325096 A | 12/2007 |
| JP | 2011-4155 A | 1/2011 |
| KR | 1020090098568 A | 9/2000 |
| KR | 1020120022156 A | 3/2012 |
| KR | 1020120069832 A | 6/2012 |

OTHER PUBLICATIONS

Hayoung Yoon et al: "Collaborative streaming-based media content sharing in WiFi-enabled home networks", IEEE Transactions on Consumer Electronics, IEEE Service Center, New York, NY, US, vol. 56, No. 4, Nov. 1, 2010 (Nov. 1, 2010), pp. 2193-2200, XP011341809 , ISSN: 0098-3063 , DOI: 10.1109/TCE.2010.5681090.

"IEEE Standard for Information technology—Telecommunications and information exchange between systems—Local and metropolitan area networks—Specific requirements", Part 11: Wireless LAN Medium Access Control (MAC) and Physical Layer (PHY) Specifications, IEEE Computer Society, IEEE Std 802.11™-2007, (Revision of IEEE Std 802.11-1999 ), Jun. 12, 2007, total 1231 pages.

Communication dated Mar. 24, 2015 issued by the State Intellectual Property Office of P.R. China in counterpart Chinese Patent Application No. 201280005413.8.

International Search Report dated Sep. 14, 2012 from the International Searching Authority in counterpart application No. PCT/KR2012/000341.

Written Opinion dated Sep. 14, 2012 from the International Searching Authority in counterpart application No. PCT/KR2012/000341.

Communication dated Oct. 20, 2015, issued by the Japanese Patent Office in counterpart Japanese Patent Application No. 2013-549368.

Communication dated Sep. 26, 2016, issued by the State Intellectual Property Office of P.R. China in counterpart Chinese Application No. 201280005413.8.

* cited by examiner

FIG. 5

| BIT OFFSET | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | VERSION | | | T | RESERVED | | | | | | | | INPUT CATEGORY | | | |
| 0 | LENGTH | | | | | | | | | | | | | | | |
| 0 | TIME STAMP (OPTIONAL) | | | | | | | | | | | | | | | |
| | INPUT BODY | | | | | | | | | | | | | | | |

FIG. 6

| INPUT CATEGORY | CATEGORY |
|---|---|
| 0 | GENERIC |
| 1 | HIDC |
| 2-15 | RESERVED |

FIG. 7

| FIELD | SIZE(OCTET) |
|---|---|
| GENERIC IE ID | 1 |
| LENGTH | 2 |
| DESCRIBE | VARIABLE |

FIG. 8

| GENERIC IE ID | NOTES |
| --- | --- |
| 0 | LEFT MOUSE DOWN/TOUCH DOWN |
| 1 | LEFT MOUSE UP/TOUCH UP |
| 2 | MOUSE MOVE/TOUCH MOVE |
| 3 | KEY DOWN |
| 4 | KEY UP |
| 5 | ZOOM |
| 6 | VERTICAL SCROLL |
| 7 | HORIZONTAL SCROLL |
| 8 | ROTATE |
| 9-255 | RESERVED |

FIG. 9

| FIELD | SIZE(OCTET) |
|---|---|
| POINTER NUMBER (N) | 1 |
| For i = 1: N { | |
| POINTER ID | 1 |
| X-COORDINATE | 2 |
| Y-COORDINATE | 2 |
| } | |

FIG. 10

| FIELD | SIZE(OCTET) |
|---|---|
| RESERVED | 1 |
| Key code 1 (ASCII) | 2 |
| Key code 2 (ASCII) | 2 |

FIG. 11

| FIELD | SIZE(OCTET) |
|---|---|
| X | 2 |
| Y | 2 |
| INTEGER TIMES TO ZOOM | 1 |
| FRACTION TIMES TO ZOOM | 1 |

FIG. 12

| FIELD | SIZE(OCTET) |
|---|---|
| HORIZONTAL/VERTICAL SCROLL AMOUNT | 2 |

FIG. 13

| FIELD | SIZE(OCTET) |
|---|---|
| INTEGER PART OF ROTATION AMOUNT | 1 |
| DECIMAL PART OF ROTATION AMOUNT | 1 |

FIG. 14

| FIELD | SIZE(OCTET) |
|---|---|
| HID INTERFACE TYPE | 1 |
| HID TYPE | 1 |
| USAGE | 1 |
| LENGTH | 2 |
| HIDC VALUE | VARIABLE |

FIG. 15

| VALUE | HID INTERFACE TYPE |
|---|---|
| 0 | INFRARED |
| 1 | USB |
| 2 | BLUETOOTH |
| 3 | ZIGBEE |
| 4 | Wi-Fi |
| 5-254 | RESERVED |
| 255 | VENDOR SPECIFIC HID INTERFACE |

FIG. 16

| 값 | HID TYPE |
|---|---|
| 0 | KEYBOARD |
| 1 | MOUSE |
| 2 | SINGLE TOUCH |
| 3 | MULTI TOUCH |
| 4 | JOYSTICK |
| 5 | CAMERA |
| 6 | GESTURE |
| 7 | REMOTE CONTROLLER |
| 8-254 | RESERVED |
| 255 | VENDOR SPECIFIC HID TYPE |

FIG. 18

| FIELD | SIZE(OCTET) | VALUE (HEXADECIMAL) |
|---|---|---|
| ELEMENT ID | 1 | |
| LENGTH | 1 | VARIABLE |
| OUI | 3 | |
| OUI TYPE | 1 | |
| WFD SUBELEMENTS | VARIABLE | |

FIG. 19

| FIELD | SIZE(OCTET) | VALUE HEXADECIMAL |
|---|---|---|
| SUBELEMENTS ID | 1 | VARIABLE |
| LENGTH | 1 | VARIABLE |
| SUBELEMENTS BODY FIELD | VARIABLE | |

FIG. 20

| SUBELEMENTS ID | NOTES |
|---|---|
| 0 | STATUS |
| 1 | WFD DEVICE INFORMATION |
| 2 | ASSOCIATED BSSID |
| 3 | COUPLED SINK INFORMATION |
| 4 | DISPLAY EDID |
| 5 | H.264 CODEC |
| 6 | LPCM CODEC |
| 7 | AAC CODEC |
| 8 | DOLBY DIGITAL CODEC |
| 9 | DTS CODEC |
| 10 | TRANSPORT CAPABILITY |
| 11 | 3D VIDEO CAPABILITY |
| 12 | LOCAL IP ADDRESS |
| 13 | CONTROL SIGNALING CAPABILITIES |
| 14-255 | RESERVED | ns
METHOD AND APPARATUS FOR TRANSMITTING USER INPUT FROM A SINK DEVICE TO A SOURCE DEVICE IN A WI-FI DIRECT COMMUNICATION SYSTEM

CROSS-REFERENCE TO RELATED APPLICATION

This application is a National Stage of International Application No. PCT/KR2012/000341, filed on Jan. 13, 2012, and claims priority from U.S. Provisional Patent Application No. 61/432,779, filed on Jan. 14, 2011, the disclosures of which are incorporated herein in their entirety by reference.

BACKGROUND

1. Field

Exemplary embodiments relate to a method and apparatus for transmitting a user's input from a sink device to a source device in a Wi-Fi direct communication scheme.

2. Related Art

Unlike existing Wi-Fi communication schemes, a Wi-Fi direct communication scheme is a network suggested by a Wi-Fi alliance, where Wi-Fi devices are connected in a peer-to-peer scheme even though the Wi-Fi devices do not participate in a home network, an office network, and a hot spot network.

In the Wi-Fi direct communication scheme, a sink device is merely a device that displays audio/video (AV) data, and cannot receive a user's input for controlling the AV data. Hence, the user has to input a command to a source device in order to control the AV data.

SUMMARY

Exemplary embodiments provide a method to address an inconvenience caused when a user's input for controlling audio/video (AV) data transmitted from a source device to a sink device always needs to be input to the source device.

According to an aspect of an exemplary embodiment, there is provided a method of performing communication between a source device and a sink device in a Wi-Fi direct network, including: receiving a user's input, by the sink device, for controlling audio/video (AV) data, and transmitting the received user's input to the source device.

According to an aspect of another exemplary embodiment, there is provided a method of performing communication between a sink device and a source device in a Wi-Fi direct network, including: receiving a user's input, by the sink device, for controlling audio/video (AV) data received from the source device; generating a message for controlling the AV data based on the user's input; and transmitting the message to the source device through a Wi-Fi direct link.

The method may further include: providing the source device with information on whether the sink device generates the message and provides the message to the source device; and transmitting parameter information for processing the message.

The parameter information may be included in a real time service protocol (RTSP) message.

The providing and the transmitting may be performed in a capability negotiation procedure.

Based on the user's input, the message for controlling the AV data may include information corresponding to at least one of a coordinate, a magnifying power of zooming, a scrolling amount, a rotation amount, and ASCII code.

Based on the user's input, the message for controlling the AV data may include information corresponding to an interface type of a human interface device (HID).

Based on the user's input, the message for controlling the AV data may include information corresponding to a type of a human interface device (HID).

According to an aspect of another exemplary embodiment, there is provided a method of performing communication between a source device and a sink device in a Wi-Fi direct network, including: receiving a message, by the source device, generated in the sink device based on a user's input to the sink device; and controlling audio/video (AV) data based on the received message in the source device, wherein the message is received through a Wi-Fi direct link.

The method may further include: requesting the sink device for information on whether the sink device generates the message and provides the message to the source device; and receiving parameter information for processing the message.

The parameter information may be included in a real time service protocol (RTSP).

According to an aspect of another exemplary embodiment, there is provided a communication device for performing communication in a Wi-Fi direct network, including: a user input reception unit that receives a user's input for controlling audio/video (AV) data received from a source device; a message generation unit that generates a message for controlling the AV data based on the user's input; and a message transmission unit that transmits the message to the source device through a Wi-Fi direct link.

The communication device may further include: a capability information providing unit that provides the source device with information on whether the sink device generates the message and provides the message to the source device; and a parameter information providing unit that provides parameter information needed for processing the message to the source device.

The parameter information may be included in a real time service protocol (RTSP) message.

Based on the user's input, the message for controlling the AV data may include information corresponding to at least one of a coordinate, a magnifying power of zooming, a scrolling amount, a rotation amount, and ASCII code.

Based on the user's input, the message for controlling the AV data may include information corresponding to an interface type of a human interface device (HID).

Based on the user's input, the message for controlling the AV data may include information corresponding to a type of a human interface device (HID).

According to an aspect of another exemplary embodiment, there is provided a communication device for performing communication in a Wi-Fi direct network, including: a message reception unit that receives a message generated in a sink device based on a user's input from the sink device; and a data controller that controls audio/video (AV) data based on the received message in the source device, wherein the message is received through a Wi-Fi direct link.

The communication device may further include: a capability information request unit that requests the sink device for information on whether the sink device generates the message and provides the message to the source device; and a parameter information reception unit that receives parameter information needed for processing the message.

The parameter information may be included in a real time service protocol (RTSP). According to an aspect of another exemplary embodiment, there is provided a method of performing communication between a sink device and a source device in a Wi-Fi direct network, the method including: generating a message for controlling audio/video (AV) data received from the source device based on a user's input to the sink device; and transmitting the message from the sink device to the source device through a Wi-Fi direct link.

The method may also include providing the source device with information corresponding to whether the sink device has a capability to control the AV data received from the source device; and transmitting parameter information for processing the message.

Accordingly, an inconvenience caused when a user's input for controlling audio/video (AV) data always needs to be input to a source device may be addressed by receiving the user's input for controlling AV data directly at a sink device in a Wi-Fi direct network, and transmitting the received user's input to the source device.

BRIEF DESCRIPTION OF THE DRAWINGS

FIG. 5 shows a structure of a message transmitted from the sink device to the source device, according to an exemplary embodiment;

FIG. 6 shows a table illustrating an input category, according to an exemplary embodiment;

FIG. 7 shows a format of a generic input body, according to an exemplary embodiment;

FIG. 8 shows a table illustrating types of a user's input of a generic input category, according to an exemplary embodiment;

FIG. 9 shows a format of an information element according to a user's mouse input, according to an exemplary embodiment;

FIG. 10 shows a format of an information element according to a user's keyboard input, according to an exemplary embodiment;

FIG. 11 shows a format of an information element according to a user's zoom input, according to an exemplary embodiment;

FIG. 12 shows a format of an information element according to a user's scroll input, according to an exemplary embodiment;

FIG. 13 shows a format of an information element according to a user's rotation input, according to an exemplary embodiment;

FIG. 14 shows a body format of a human interface device class (HIDC) according to an exemplary embodiment;

FIG. 15 shows a table illustrating a type of a human interface device (HID) according to an exemplary embodiment;

FIG. 16 shows a table illustrating a type of an HID according to an exemplary embodiment;

FIG. 18 shows a format of a Wi-Fi display (WFD) information element according to an exemplary embodiment;

FIG. 19 shows a format of a WFD subelement according to an exemplary embodiment; and FIG. 20 shows a table illustrating a WFD subelement ID according to an exemplary embodiment.

DETAILED DESCRIPTION OF EXEMPLARY EMBODIMENTS

Figure 1:
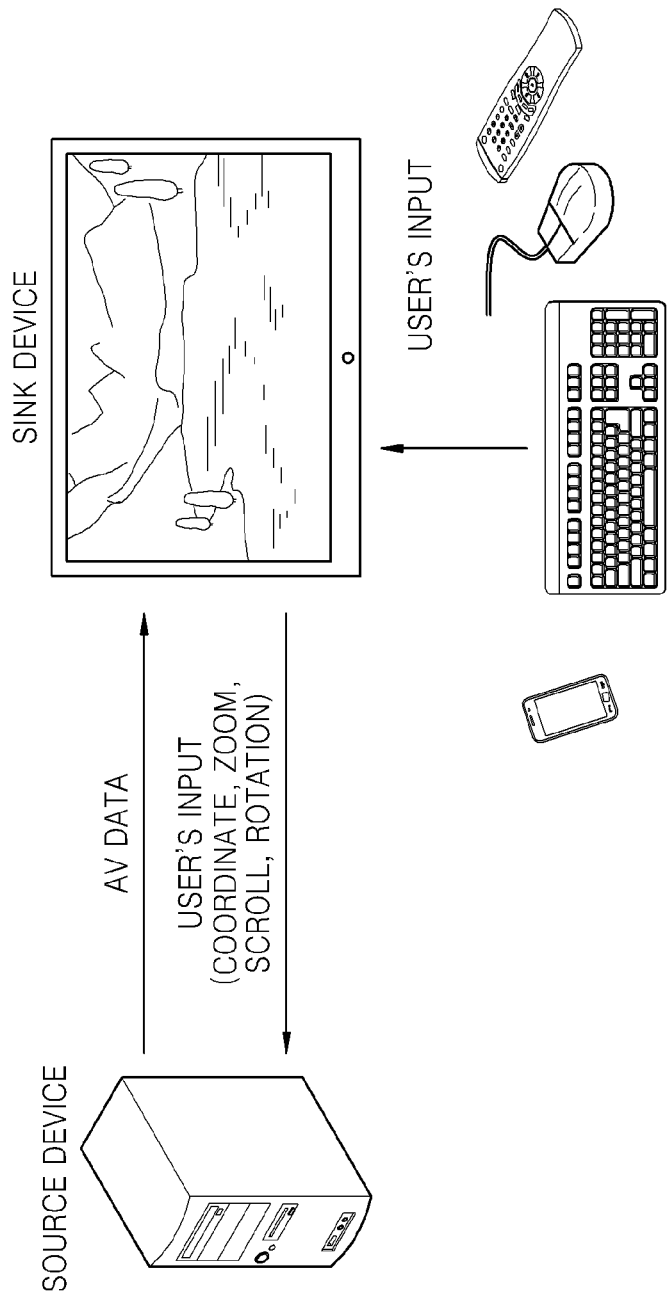
FIG. 1 shows a conceptual diagram illustrating a communication scheme between a sink device and a source device, according to an exemplary embodiment.

Exemplary embodiments will now be described more fully with reference to the accompanying drawings. Like reference numerals in the drawings denote like elements, and thus their description will be omitted. The size of each component of drawings may be exaggerated for clarity of description.

FIG. 1 is a conceptual diagram illustrating a communication scheme between a sink device and a source device according to an exemplary embodiment.

A Wi-Fi display (WFD) is a communication scheme where display devices communicate based on a Wi-Fi direct communication standard.

A source device is a device that provides data, and a sink device is a device that receives data. In the Wi-Fi direct communication scheme, the source device and the sink device are determined in the capability negotiation operation according to the capability of a device. In particular, the sink device may include a device that displays audio/video (AV) data.

According to an exemplary embodiment, the sink device receives a user's input for controlling AV data, and a user may directly input a command for controlling AV data through a scheme that transmits information corresponding to the user's input received by the sink device to the source device.

The sink device may provide information corresponding to the input received from the user to the source device via a user input back channel (UIBC).

Information corresponding to the user's input for controlling AV data may be of various types, such as a mouse input (coordinates), a keyboard input, a zoom input, a scroll input, and a rotation input.

Figure 2:
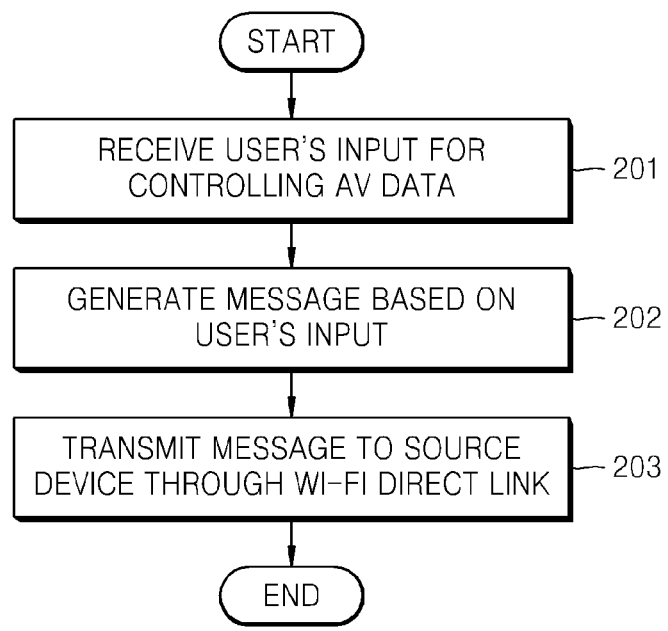
FIG. 2 shows a flowchart illustrating a procedure of performing a communication between the sink device and the source device, according to an exemplary.

FIG. 2 shows a flowchart illustrating a procedure of performing a communication between the sink device and the source device in a Wi-Fi direct network, according to an exemplary embodiment.

In operation 201, the sink device receives a user's input for controlling AV data. Before receiving the user's input, the sink device may transmit information on whether a function of receiving the user's input and transmitting the user's input to the source device is supported. The sink device may transmit parameter information needed for processing the user's input along with the information on whether the function of transmitting the user's input to the source device is supported.

The operation of transmitting the parameter information needed for processing the user's input along with the function of transmitting the user's input to the source device via the UIBC (User Input Back Channel) may be performed in a capability negotiation procedure or a service discovery procedure.

Furthermore, the parameter information may be included in a real time streaming protocol (RTSP).

In operation 202, the sink device generates a message based on the user's input. When the message is generated based on the user's input, the message is generated according to the structure of FIG. 5, which will be described in detail below with reference to FIG. 5.

When the message based on the user's input is generated, interface type information of a human interface device (HID) may be included in the message, and type information of the HID may be included in the message, as described later in detail with reference to FIGS. 15 and 16.

In operation 203, the sink device transmits the message to the source device through the Wi-Fi direct link. The source device communicates with the sink device through the WFD scheme, and thus the source device is connected to the sink device through the Wi-Fi direct link. Furthermore, the sink device may provide information corresponding to the input received from the user to the source device in the form of a message through the UIBC connected to the source device.

Figure 3:
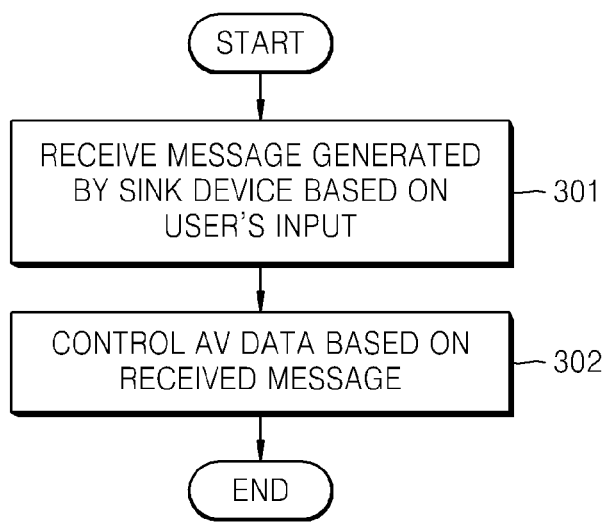
FIG. 3 shows a flowchart illustrating a procedure of performing a communication between a source device and a sink device, according to another exemplary embodiment.

FIG. 3 shows a procedure of performing a communication between a source device and a sink device, according to another exemplary embodiment.

In operation 301, the source device receives a message generated in the sink device based on the user's input. Before receiving the message, the source device may request the sink device for information on whether a function of transmitting the user's input received by the sink device to the source device is supported. The source device may receive parameter information needed for processing the user's input in response to the request of the information on whether the function of transmitting the user's input to the source device is supported.

The operation of receiving the parameter information needed for processing the user's input and the requesting for information on whether a function of transmitting the user's input from the sink device to the source device may be performed in the capability negotiation procedure or the service discovery procedure.

Furthermore, the parameter information may be included in the RTSP.

In operation 302, the source device controls AV data based on the received message which is generated by the sink device. The source device and sink device may control AV data through a device that performs an input through a pointer, such as a mouse, a touch pad, and a touch panel, or may input an ASCII code value as in a keyboard. Furthermore, the AV data may be AV data, which is streaming in the sink device. AV data may be controlled by inputting zoom magnification, a scroll amount, and a rotation amount in the streaming AV data.

Figure 4:
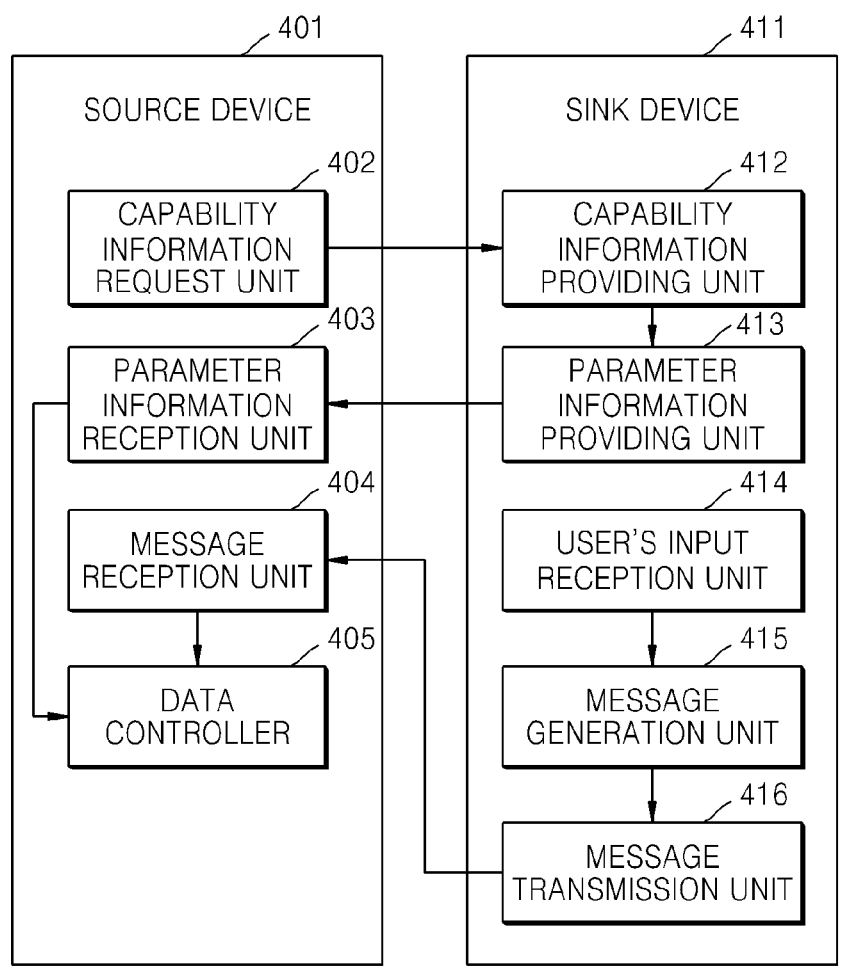
FIG. 4 shows a block diagram illustrating a structure of the source device and the sink device, according to an exemplary embodiment.

FIG. 4 shows a structure of a source device 401 and a sink device 411 according to an exemplary embodiment.

The source device 401 includes a capability information request unit 402, a parameter information reception unit 403, a message reception unit 404, and a data controller 405.

The capability information request unit 402 requests for information on whether the sink device 411 linked by a Wi-Fi direct link provides a function of receiving a user's input and transmitting the user's input to the source device 401 through the set UIBC.

The parameter information reception unit 403 receives, from the sink device 411, a parameter for processing a message generated based on the user's input.

The message reception unit 404 receives the message generated in the sink device 411 based on the user's input.

The data controller 405 controls AV data based on the message generated from the user's input received from the sink device 411.

The sink device 411 includes a capability information providing unit 412, a parameter information providing unit 413, a user's input reception unit 414, a message generation unit 415 and a message transmission unit 416.

In response to the request of the source device 401, the capability information providing unit 412 provides information on whether the sink device 411 linked by the Wi-Fi direct link provides the function of receiving the user's input and transmitting the user's input to the source device through the set UIBC.

The parameter information providing unit 413 provides to the source device 401 parameter information needed for processing the message generated based on the user's input to the source device 401.

The user's input reception unit 414 receives a user's input to control AV data.

The message generation unit 415 generates a message based on the user's input in order to transmit the user's input to the source device 401 through the UIBC.

The message transmission unit 416 transmits the message generated based on the user's input to the source device 401 through the UIBC.

FIG. 5 shows a structure of a message transmitted from the sink device to the source device, according to an exemplary embodiment.

According to an exemplary embodiment, a version field represents a version of a protocol and has a 2-bit size.

According to an exemplary embodiment, a T field is an abbreviation of a time stamp, represents whether a time stamp field exists, and has a 1-bit size. The time stamp field is selective, and when T is 0, it indicates that the time stamp field does not exist and when T is not 0, it indicates that the time stamp field exists.

According to an exemplary embodiment, a reservation field exists in preparation of a situation when the received field is needed, and has an 8-bit size. The reservation field is displayed as 0s.

According to an exemplary embodiment, a length field represents a length of an entire message and has an 8-bit size.

According to an exemplary embodiment, an input category field shows a category of an input transmitted through a message, and has a 4-bit size. The input category is divided into a generic input and an input about a HID. The input device will be described later in detail with reference to FIG. 6.

According to an exemplary embodiment, the time stamp field is an optional field, and displays a time stamp of a real time protocol (RTP) of a frame displayed by the application of the user's input. According to an exemplary embodiment, the time stamp field has a 16-bit size.

According to an exemplary embodiment, the input body field is a field including information corresponding to the user's input. The content about a generic input or an HID input is inserted into the input body field.

FIG. 6 shows a table illustrating an input category, according to an exemplary embodiment.

According to an exemplary embodiment, the input category is divided into information on a generic input and information on a human interface device class (HIDC), as described in FIG. 5. When the input category is displayed as 0, the message of FIG. 5 includes an information element about a generic input, and when the input category is displayed as 1, the message includes an information element corresponding to the HIDC.

According to an exemplary embodiment, the generic input includes information such as a movement, click, touch, zoom magnification, scroll amount, and rotation amount of a mouse, a touch pad, etc.

According to an exemplary embodiment, the user interface device information element includes information corresponding to a standard (HID interface type) through which the user's device has been connected to the sink device, and an input device (HID type) to which the sink device has been connected.

FIG. 7 shows a format of a generic input body according to an exemplary embodiment.

According to an exemplary embodiment, the format of the generic input body includes a generic IE ID field, a length field, and a description field.

According to an exemplary embodiment, the generic IE ID field is a field for distinguishing types of a user's input in a generic input category, as described later in detail with reference to FIG. 8.

According to an exemplary embodiment, the length field represents a length of the entire field and has a 2-octet size.

According to an exemplary embodiment, the description field represents the actual content of the user's input. That is, the actual content of the user's input, such as coordinates, number, zoom magnification, scroll amount, and rotation amount, is displayed. The content disclosed in the description field will be described in detail with reference to FIGS. 9 to 13.

FIG. 8 shows a table illustrating types of a user's input of a generic input category, according to an exemplary embodiment.

FIG. 8 illustrates the types of the user's input which may be disclosed in the generic IE ID field of the input body format.

According to an exemplary embodiment, Down refers to an operation of pressing a mouse button or key, and Up refers to an operation of releasing the mouse button or key. The message may be transmitted for the user's input of various forms, such as a click of a left or right button of a mouse, and a movement, zoom, scroll, rotation, etc. of a mouse or a touch pad.

Furthermore, the generic IE ID may be omitted as necessary.

FIG. 9 shows an information element according to a user's mouse input according to an exemplary embodiment.

FIG. 9 illustrates a case where the sink device receives a user's input through a mouse in order to control AV data, and the content of FIG. 9 may be written in the description field of the generic input body of FIG. 7.

According to an exemplary embodiment, the number field of the pointer represents the number of pointers. For example, a plurality of pointers may be provided. In the case of the mouse, there is one pointer. However, in the case of a touch pad, a multi-touch is supported, and thus two or more points may be provided. Hence, when there is a plurality of pointers, information for each pointer may be written using a construction (expression) using a "For loop" coding scheme. A "For loop" coding scheme is well known to those skilled in the art, and thus the detailed description thereof is omitted here.

According to an exemplary embodiment, the pointer ID field represents an ID for distinguishing each pointer when there is a plurality of pointers.

According to an exemplary embodiment, x-coordinate and y-coordinate fields respectively represent the x-coordinate and y-coordinate of each pointer, which may be normalized according to the resolution of the video stream.

FIG. 10 shows an information element of a user's keyboard input according to an exemplary embodiment.

FIG. 10 illustrates a case where the sink device receives a user's input through a keyboard to control AV data, and the content of FIG. 10 may be written in the description field of the generic input body of FIG. 7.

According to an exemplary embodiment, a total of two key code fields are provided because there is a case where two keys may need to be input at one time as in a shortcut key. According to an exemplary embodiment, each key code field has a 2-octet size, and an input key is indicated by ASCII code. Generally, the ASCII code is indicated by a size less than 1 byte, and the remaining 1 byte is a byte reserved for compatibility when ASCII code is changed later.

Furthermore, when only one key is input, Key Code II field is indicated as 0.

FIG. 11 shows an information element according to a user's zoom input, according to an exemplary embodiment.

According to an exemplary embodiment, x-coordinate field and y-coordinate fields respectively indicate x and y coordinates referred to for a zoom operation. The x and y coordinates may be normalized according to the resolution of the video stream.

According to an exemplary embodiment, the integer times to zoom field represents an integer part of the magnifying power of the zoom operation. For example, if the zoom magnifying power is 2.5, "2", which is the integer part of 2.5, is displayed in the integer part of the zoom magnifying power. Furthermore, the zoom operation is performed only as magnification, and thus only an unsigned integer is displayed.

According to an exemplary embodiment, the fraction times to zoom field represents a decimal part of the magnifying power of the zoom operation. For example, if the zoom magnifying power is 2.5, "0.5" which is the decimal part of 2.5 is displayed in the decimal part of the zoom magnifying power.

FIG. 12 shows an information element according to a user's scroll input according to an exemplary embodiment.

According to an exemplary embodiment, the amount to scroll field displays the number of pixels changed according to the scroll according to the resolution.

Furthermore, according to an exemplary embodiment, the scroll operation may be performed horizontally and vertically, and in a specified direction (left and right or upward and downward), and thus is indicated by a signed integer. For example, a negative integer represents a right or upward scroll operation, and a positive integer represents a left or downward scroll operation is displayed.

FIG. 13 shows an information element according to a user's rotation input according to an exemplary embodiment.

According to an exemplary embodiment, the integer portion of rotation amount field represents an integer part of the rotation amount. The rotation amount is indicated in radian units. The rotation operation also has a direction (clockwise or counterclockwise direction), and thus is indicated by a signed integer. For example, in the case of a negative integer, a clockwise rotation is displayed, and in the case of a positive integer, a counterclockwise rotation is displayed.

According to an exemplary embodiment, the fraction portion of rotation amount represents a fraction part of the magnifying power of the zoom operation.

FIG. 14 shows a body format of an HIDC, according to an exemplary embodiment.

According to an exemplary embodiment, the body format of the HIDC includes HID interface type, HID type, usage, length, and HIDC value fields.

According to an exemplary embodiment, the HID interface type field represents a connection type of the HID interface, as described later in detail with reference to FIG. 15.

According to an exemplary embodiment, the HID type field represents the types of the HID, as described later in detail with reference to FIG. 16.

According to an exemplary embodiment, the usage field is a field corresponding to the HIDC value, and displays the usage of the content written in the HIDC value field, such as whether the HIDC value is used in the HID input report or is used as a HID report descriptor.

According to an exemplary embodiment, the length field displays the length of the entire message and has a 2-octet size.

According to an exemplary embodiment, the HIDC value field displays content on the HID input report or description on the HID input, and the size of the HIDC value field is variable.

FIG. 15 shows a table illustrating a type of an HID according to an exemplary embodiment.

According to an exemplary embodiment, the connection type between the sink device and the HID device is illustrated by each value. The connection types may include an infrared type, a universal serial bus (USB) type, a Bluetooth type, a ZigBee type and a Wi-Fi type. The connections types are obvious to those skilled in the art, and thus the detailed description thereof is omitted here.

Furthermore, a connection type that is later newly used may be matched with value 5-254 so as to be used to identify a new type of connection, and the vendor specific HID interface may be used by defining a new connection type that that is not defined by the vendor.

FIG. 16 shows a table illustrating a type of an HID according to an exemplary embodiment.

According to an exemplary embodiment, FIG. 16 shows HID interface types, i.e., types of an input device connected to the sink device. Some examples of the HID are a keyboard and a mouse, and in the case of a touch pad or a touch panel, there is a single touch and a multi touch. Furthermore, there are other examples, such as a joystick, a camera, a gesture, and a remote controller.

Furthermore, a new input device may be matched with the value 5-254 so as to be used to identify the new input device.

Figure 17:
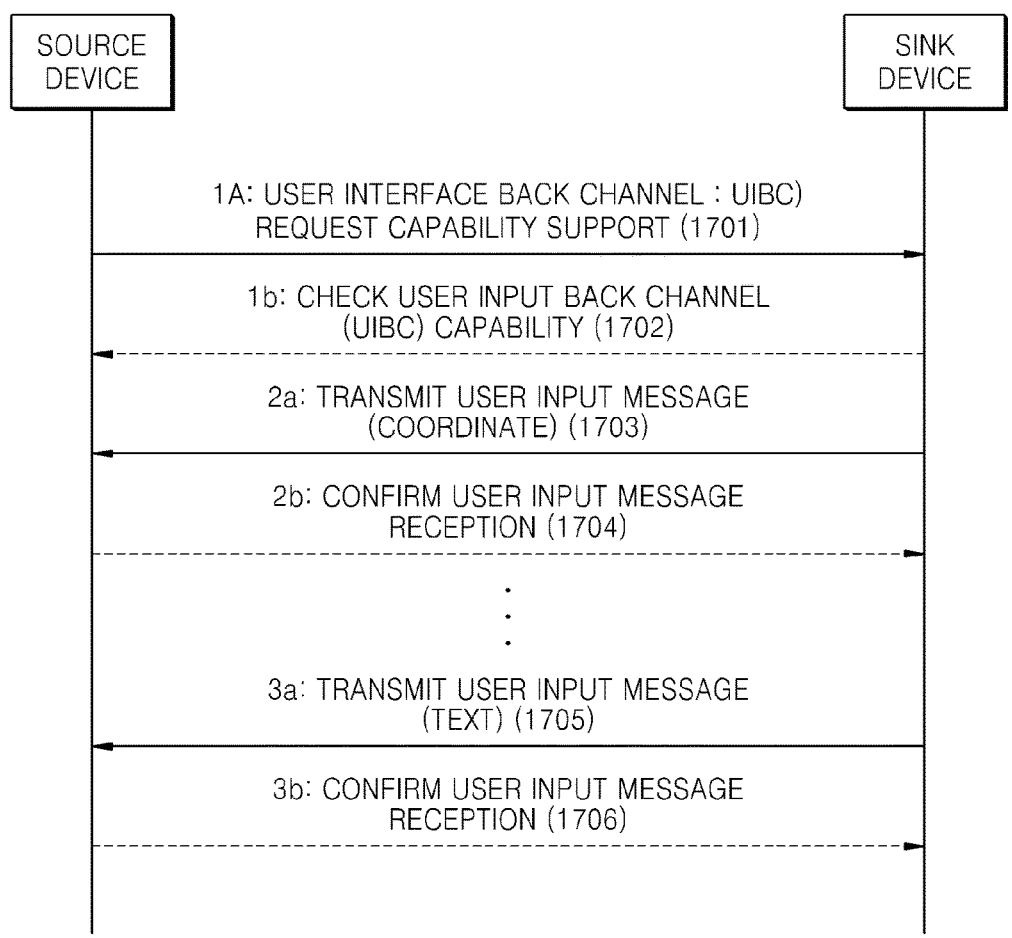
FIG. 17 shows a signal flowchart of a communication between the source device and the sink device, according to an exemplary embodiment.

FIG. 17 shows a signal flowchart of a communication between the source device and the sink device, according to an exemplary embodiment.

In operation 1701, the source device requests information on whether a UIBC capability is supported from the sink device. The UIBC is a channel for transmitting a user's input that is set based on a Wi-Fi direct scheme in order to transmit to the source device information corresponding to the input that the sink device receives from the user.

In operation 1702, in response the request of the information on whether the UIBC capability is supported, the sink device transmits information on whether the UIBC capability is supported.

In operation 1703, if a coordinate-related input is received, the sink device generates a message according to the format of FIG. 5, and transmits the message.

In operation 1704, in response the transmission of the message generated based on the user's input of the sink device, the source device transmits a message reception confirmation signal to the sink device.

Operation 1705 is similar to operation 1703, and a case where the sink device receives an input corresponding to text data from the user is illustrated.

In operation 1706, the source device transmits a message reception confirmation signal as in operation 1704.

Data that may be included in the user's input message in each operation may further include at least one of the rotation amount information and the magnifying power of the zoom information as described above.

FIG. 18 shows a WFD information element according to an exemplary embodiment.

According to an exemplary embodiment, the WFD information element represents a format of a frame that receives basic information, such as a device type and state. The probe request frame or probe response frame may also be written according to the format of the WFD information element. The request and response of information on whether the function (e.g., UIBC) of transmitting an input received from the user from the sink device to the source device is transmitted using the WFD information element.

According to an exemplary embodiment, the WFD IE includes an element ID field, a length field, an organization unique identifier (OUI) field, an OUI type field, and a WFD subelement field. According to an exemplary embodiment, the element ID field, the length field, the OUI field, and OUI type field have 1, 1, 3 and 1 octet sizes, respectively, and the size of the WFD subelement field is variable.

According to an exemplary embodiment, the element ID field is a field used when the vendor desires to make functions that are not defined in the IEEE 802.11 standard, and the length field represents the entire length of the WFD information element.

According to an exemplary embodiment, the OUI field is a unique identifier that distinguishes each vendor.

According to an exemplary embodiment, the OUI type field represents a version of the WFD information element.

According to an exemplary embodiment, the content written simply in the WFD information element is not sufficient for the WFD subelement field, and thus content indicating detailed device information is included, and the content included in the WFD subelement will be described with reference to FIG. 19.

Some of the WFD information elements may be omitted as necessary.

FIG. 19 shows a general format of a WFD subelement according to an exemplary embodiment.

According to an exemplary embodiment, the WFD subelement includes subelement ID, length, and subelement body fields. According to an exemplary embodiment, the subelement ID and length fields have respectively one octet size, and the size of the subelement body field is variable.

According to an exemplary embodiment, the subelement ID displays the type of the WFD subelement, which will be described in detail with reference to FIG. 20.

According to an exemplary embodiment, the length field represents the entire length of the WFD subelement.

According to an exemplary embodiment, the subelement body field shows details of the subelement.

Some of the WFD subelements may be omitted as is necessary.

FIG. 20 shows a table illustrating a WFD subelement ID according to an exemplary embodiment.

According to an exemplary embodiment, the WFD device information means information on the WFD device. The information corresponding to the UIBC capability may also be included in the WFD device information field.

The status of the present embodiment indicates the status information of the device, and the display EDID represents the type of data for transmitting display information of the device. Furthermore, the coupled sink information of the present embodiment shows whether connected to another device.

The remaining subelement ID is about the Codec, device capability and address which may be easily understood by those skilled in the art, and thus the detail description thereof is omitted here.

Some of the subelement IDs may be omitted as necessary.

Exemplary embodiments may also be embodied as computer-readable codes on a computer-readable recording medium. The computer-readable recording medium is any data storage device that can store data which can be thereafter read by a computer system and executed by using a processor. Examples of the computer-readable recording medium include read-only memory (ROM), random-access memory (RAM), CD-ROMs, magnetic tapes, floppy disks, optical data storage devices, etc. The computer-readable recording medium can also be distributed over network-coupled computer systems so that the computer-readable code is stored and executed in a distributed fashion.

While exemplary embodiments have been particularly shown and described with reference to the drawings, it will be understood by those of ordinary skill in the art that various changes in form and details may be made therein without departing from the spirit and scope of the inventive concept as defined by the following claims.

The invention claimed is:

1. A method of performing communication between a sink device and a source device in a peer to peer network, the method comprising:
   receiving, by the sink device, from the source device, a probe request message;
   transmitting, by the sink device, to the source device, a probe response message including information on whether a function of transmitting a user's input received by the sink device to the source device is supported by the sink device in response to receiving the probe request message from the source device;
   transmitting, by the sink device, to the source device, parameter information needed for processing a message for controlling audio/video (AV) data;
   receiving, by the sink device, the AV data from the source device;
   receiving, by the sink device, the user's input through a user input device, wherein the user's input is an input for controlling the AV data received from the source device;
   generating, by the sink device, the message for controlling the AV data based on the user's input; and
   transmitting, by the sink device, the message for controlling the AV data to the source device through a peer to peer link such that the AV data is controlled by the source device based on the message.

2. The method of claim 1, wherein the parameter information is included in a real time service protocol (RTSP) message.

3. The method of claim 1, wherein the providing and the transmitting are performed in a capability negotiation procedure.

4. The method of claim 1, wherein the message for controlling the AV data comprises information corresponding to at least one of a coordinate, a magnifying power of zooming, a scrolling amount, a rotation amount, and ASCII code.

5. The method of claim 1, wherein the message for controlling the AV data comprises information corresponding to an interface type of a human interface device (HID).

6. The method of claim 1, wherein the message for controlling the AV data comprises information corresponding to a type of a human interface device (HID).

7. A method of performing communication between a source device and a sink device in a peer to peer network, the method comprising:
   transmitting, by the source device to the sink device, a probe request message;
   receiving, by the source device, from the sink device, a probe response message including information on whether a function of transmitting a user's input received by the sink device to the source device is supported by the sink device in response to transmitting the probe request message to the sink device;
   receiving, by the source device, from the sink device, parameter information needed for processing a message for controlling audio/video (AV) data;
   transmitting, by the source device, the AV data to the sink device;
   receiving, by the source device, the message for controlling the AV data and generated in the sink device based on the user's input received by the sink device, the user's input being an input for controlling the AV data and inputted to the sink device through a user input device; and
   controlling, by the source device, the AV data based on the received message,
   wherein the message for controlling the AV data is received through a peer to peer link such that the AV data is controlled by the source device based on the message.

8. The method of claim 7, wherein the parameter information is included in a real time service protocol (RTSP).

9. A communication device for performing communication in a peer to peer network, the communication device configured to receive audio/video (AV) data from a source device and comprising:
   a capability information providing unit which is configured to receive a probe request message and transmit a probe response message including information on whether a function of transmitting a user's input received by the communication device to the source device is supported by the communication device in response to receiving the probe request message from the source device;
   a parameter information providing unit which is configured to provide parameter information needed for processing a message for controlling the AV data to the source device;
   a user input reception unit which is configured to receive the user's input through a user input device, wherein the user's input is an input for controlling the AV data received from the source device;
   a message generation unit which is configured to generate the message for controlling the AV data based on the user's input; and
   a message transmission unit which is configured to transmit the message for controlling the AV data to the source device through a peer to peer link such that the AV data is controlled by the source device based on the message.

10. The communication device of claim 9, wherein the parameter information is included in a real time service protocol (RTSP) message.

11. The communication device of claim 9, wherein the message for controlling the AV data comprises information corresponding to at least one of a coordinate, a magnifying power of zooming, a scrolling amount, a rotation amount, and ASCII code.

12. The communication device of claim 9, wherein the message for controlling the AV data comprises information corresponding to an interface type of a human interface device (HID).

13. The communication device of claim 9, wherein the message for controlling the AV data comprises information corresponding to a type of a human interface device (HID).

14. A communication device for performing communication in a peer to peer network, the communication device configured to transmit audio/video (AV) data to a sink device and comprising:
  a capability information request unit which is configured to transmit a probe request message to the sink device and receive, from the sink device, a probe response message including information on whether a function of transmitting a user's input received by the sink device to the communication device is supported by the sink device in response to transmitting the probe request message;
  a parameter information reception unit that is configured to receive parameter information for processing a message for controlling the AV data, wherein the message is generated in the sink device based on the user's input inputted to the sink device through a user input device;
  a message reception unit which is configured to receive the message for controlling the AV data and generated in the sink device based on the user's input inputted to the sink device; and
  a data controller which is configured to control the AV data based on the received message in the communication device,
  wherein the message is received through a peer to peer link such that the AV data is controlled by the communication device based on the message.

15. The communication device of claim 14, wherein the parameter information is included in a real time service protocol (RTSP).

16. A non-transitory computer-readable recording medium having recorded a program for implementing a method disclosed in claim 1.

\* \* \* \* \*